United States Patent [19]

Tharmaratnam

[11] 3,740,657

[45] June 19, 1973

[54] TRANSISTOR PUSH-PULL AMPLIFIER

[75] Inventor: Poothathamby Tharmaratnam, Mollenhutseweg, Nijmegen, Netherlands

[73] Assignee: U.S. Philips, New York, N.Y.

[22] Filed: Apr. 1, 1971

[21] Appl. No.: 130,187

[30] Foreign Application Priority Data

June 13, 1970 Netherlands .................... 7008685

[52] U.S. Cl. .................... 330/15, 330/17, 330/24, 330/18

[51] Int. Cl. .................... H03f 3/26

[58] Field of Search .................... 330/15

[56] References Cited

UNITED STATES PATENTS

| | | | |
|---|---|---|---|
| 3,611,170 | 10/1971 | Wheatley, Jr. | 330/15 X |
| 3,493,879 | 2/1970 | Stanley | 330/17 |
| 3,529,254 | 9/1970 | Hill | 330/15 |

*Primary Examiner*—Nathan Kaufman
*Attorney*—Frank R. Trifari

[57] ABSTRACT

A transistor amplifier includes two coupled push-pull amplifier stages and bias stabilization is achieved by the use of a diode-transistor combination in the emitter leads of the respective complementary transistors which comprise the first stage.

2 Claims, 1 Drawing Figure

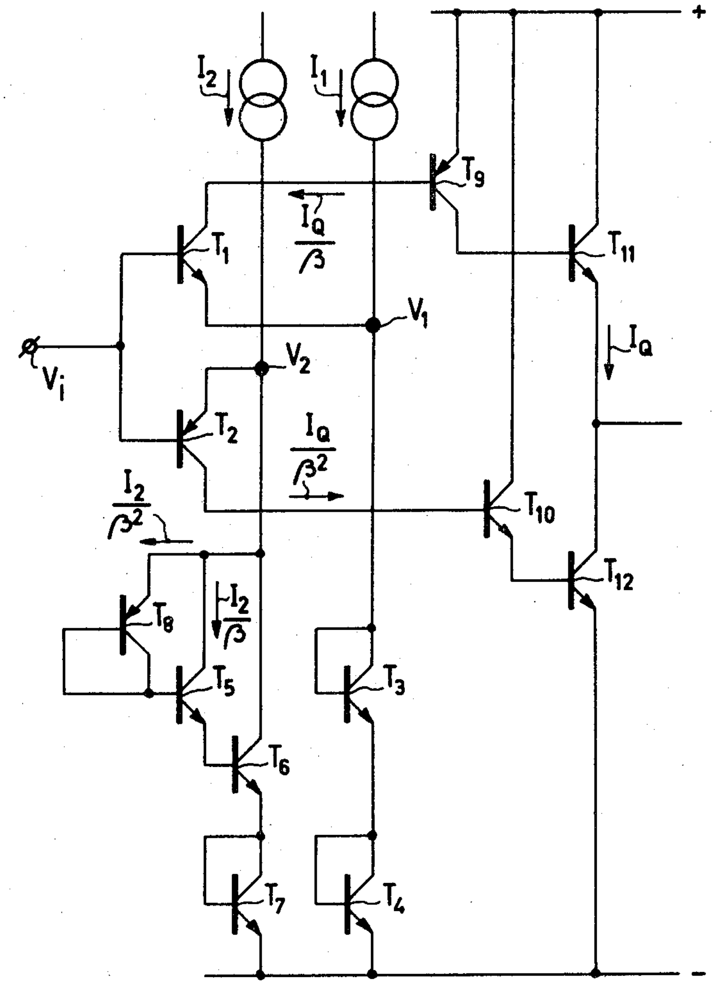
INVENTOR.
POOTHATHAMBY THARMARATNAM
BY
AGENT

TRANSISTOR PUSH-PULL AMPLIFIER

The invention relates to a transistor push-pull amplifier for integrated circuits, which includes a first stage comprising two transistors of opposite conductivity types the bases of which have an applied input signal and the collector currents of which are supplied to a second push-pull amplifier stage. The second amplifier stage generally includes an output stage comprising two transistors of the same conductivity type the collector-emitter paths of which are connected in series to a supply source, while a bias voltage by means of temperature-dependent diodes may be produced between the two bases of the output transistors to provide bias stabilization of these output transistors. However, such a circuit arrangement has the disadvantage that the bias current flowing through such a diode must be considerably higher than the bias current of the output transistors, with consequent current losses and insufficiently reliable bias stabilization.

The invention is based on another basic principle and is characterized in that the bases of the transistors of the first stage are interconnected via a negligibly small impedance, that the emitter lead of one of the transistors of the input stage includes at least one diode and the emitter lead of the other of the transistors of the first stage includes at least the collector-emitter path of a first transistor, the collector-base path of which is shunted by the collector-emitter path of a second transistor the collector-base path of which is shunted by a diode.

The invention is based on the recognition that the inclusion of the elements in the emitter leads of the transistors causes a voltage of just such a value to be set up between the emitters of the transistors of the first stage that reliable bias stabilization is achieved. In addition, it has been found in the embodiment to be described hereinafter that a higher driving range is obtained than in known circuit arrangements, and in the case of operation with low supply voltages of, say, 1.5 volts this is a considerable advantage.

An embodiment of the invention will now be described, by way of example, with reference to the accompanying drawing the single FIGURE of a transistor push-pull amplifier according to the invention.

Referring now to the FIGURE, there is shown an amplifier which includes a first stage comprising transistors $T_1$ and $T_2$ of opposite conductivity types the transistor $T_1$ is of the npn type and the transistor $T_2$ is of the pnp type. The collector current of the transistor $T_1$ is supplied to the base of a transistor $T_9$ of the pnp type the collector current of which is supplied to the base of a transistor $T_{11}$ of the npn type. The collector current of the transistor $T_2$ is supplied to the base of a transistor $T_{10}$ of the npn type the emitter current of which is supplied to the base of the transistor $T_{12}$ of the npn type. The emitter-collector paths of the transistors $T_{11}$ and $T_{12}$ are connected in series to the supply voltage, and the output voltage is taken from the junction point of the emitter of the transistor $T_{11}$ and the collector of the transistor $T_{12}$. Thus, the transistors $T_{11}$ and $T_{12}$ form a known output stage, and the transistors $T_9$ and $T_{10}$ form an intermediate stage connected between the output stage and the first stage $T_1$ and $T_2$.

The input signal $V_i$ to be amplified is applied to the bases of the transistors $T_1$ and $T_2$, which bases are interconnected through a negligibly small impedance. Two transistors $T_3$ and $T_4$ connected as diodes are included in the emitter lead of the transistor $T_1$, while the emitter lead of the transistor $T_2$ includes a transistor $T_7$ connected as a diode and the collector-emitter path of a transistor $T_6$ the collector-base path of which is shunted by the collector-emitter path of a transistor $T_5$ the collector-base path of which is shunted by a transistor $T_8$ connected as a diode. If desired, the diodes $T_4$ and $T_7$ may be combined to form a common diode circuit, in which case the emitters of the transistors $T_6$ and $T_3$ are interconnected.

In practice, the transistors shown are in the form of an integrated circuit in a semiconductor element, the transistors shown in the FIGURE as npn transistors being constituted by transversal transistors and the transistors shown as pnp transistors by lateral transistors. Current adjustment of the amplifier is effected by means of current sources $I_1$ and $I_2$, which in practice take the form of lateral pnp transistors, the emitters of which are connected through resistors to the positive supply terminal, the bases of which are connected to one another and, through at least one diode polarized in the forward direction, to the positive supply terminal, while the collectors are connected to the emitters of the transistors $T_1$ and $T_2$ respectively.

Under the described conditions the npn transistors may be expected to have a high base-collector current amplification factor $\beta$ of, say, several hundreds. In contrast therewith, the pnp transistors will normally have a comparatively small current amplification factor of, say, less than 5. However, by the alternate use of npn and pnp transistors the overall current amplification factor of the branch $T_1T_9T_{11}$ is equal to that of the branch $T_2T_{10}T_{12}$. This is based on the assumption that at least the transistors $T_1$ and $T_{10}$, the transistors $T_2$ and $T_9$ and the transistors $T_{11}$ and $T_{12}$ are equal one to the other.

Assuming the desired bias current for the output transistors $T_{11}$ and $T_{12}$ to be equal to $I_Q$ and, for convenience, the base-collector current amplification factor of the pnp transistors $T_9$ and $T_2$ to be unity, then the required bias currents of the transistors $T_1$ and $T_2$ must be $I_Q/\beta$ and $I_Q/\beta^2$ respectively. The current sources $I_1$ and $I_2$, which are assumed to be equal, will apply to the emitters of the transistors $T_1$ and $T_2$ voltages $V_1$ and $V_2$ respectively the difference of which is determined by the difference of the voltages across the circuit $T_3$ and $T_4$ and the circuit $T_5$ to $T_8$. In this case, the voltages across the diodes $T_4$ and $T_7$, which are assumed to be equal, will be equal. The voltage across the diode $T_3$ is equal to the emitter-base voltage of the transistor $T_6$, which is assumed to be equal to the transistor $T_3$; the transistor $T_6$ normally is made equal to the transistor $T_1$. Neglecting the current flowing through the transistor $T_2$, the current source $I_2$ will now produce a current $I_2/\beta$ through the transistor $T_5$ and a current $I_2/\beta^2$ through the diode $T_8$. These currents are equal to the currents flowing through the transistors $T_1$ and $T_2$ respectively, provided that $I_Q = I_2$. In this case, the emitter-base voltage of the transistor $T_2$ will always be equal to the voltage across the diode $T_8$, and the emitter-base voltage of the transistor $T_1$ will always be equal to that of the transistor $T_5$, irrespective of temperature variations.

It will be clear that many modifications of the circuit arrangement described are possible. Thus, in principle it is possible to depart from the rule of making all the npn transistors in the semiconductor element equal, while still ensuring that the ratio between the density of the current through the emitter-base junction of the transistor $T_5$ and that of the current through the diode $T_8$ is exactly equal to the ratio between the current density through the emitter -base junction of the transistor $T_1$ and that through the transistor $T_2$. The base-collector current amplification factors of the pnp transistors $T_2$ and $T_9$ may be made unity by shunting their emitter-base paths by equal diodes. If the base-collector current amplification factor of the lateral pnp transistors $T_2$ and $T_9$ exceeds unity, then the current source $I_2$ must be chosen to be correspondingly greater than the current source $I_1$ (this may for example be achieved by choosing different values for the emitter resistors described with reference to the current sources). Furthermore, the intermediate stage $T_9$, $T_{10}$ may be extended to include further npn transistors connected as emitter followers without altering the principle of the circuit arrangement. As an alternative, the output stage $T_{11}T_{12}$ may be dispensed with, in which case the collectors of the transistors $T_9$ and $T_{10}$ are interconnected and used as the output terminal (in which event the connection to the positive supply terminal will obviously be omitted).

What is claimed is:

1. A transistor amplifier comprising a first push-pull amplifier stage, said first stage comprising a pair of complementary transistors, means to interconnect the bases of the complementary transistors so that there is a negligibly small impedance therebetween, input signal means coupled to said bases, first and second current input means connected to the emitters of said complementary transistors, at least one diode in the emitter lead of one of the complementary transistors, a first transistor, means to couple the collector-emitter path of the first transistor in the emitter lead of the other of the complementary transistors, a second transistor, means to couple the collector-emitter path of the second transistor to shunt the collector-base path of the first transistor, a second diode, means to couple the second diode to shunt the collector-base path of the second transistor, said diodes being poled in a current carrying direction, a second push-pull amplifier stage, means to couple the collector currents of the complementary transistors to the second stage and means for deriving an output signal from said second stage.

2. An amplifier as claimed in claim 1, wherein the second stage comprises a second pair of complementary transistors, the emitter-collector paths of the second complementary pair being in series with a supply voltage source for the transistor amplifier.

* * * * *